United States Patent [19]

Lin et al.

[11] Patent Number: 5,450,283
[45] Date of Patent: Sep. 12, 1995

[54] THERMALLY ENHANCED SEMICONDUCTOR DEVICE HAVING EXPOSED BACKSIDE AND METHOD FOR MAKING THE SAME

[75] Inventors: Paul T. Lin; Michael B. McShane, both of Austin, Tex.

[73] Assignee: Motorola, Inc., Schaumburg, Ill.

[21] Appl. No.: 179,892

[22] Filed: Jan. 10, 1994

Related U.S. Application Data

[63] Continuation of Ser. No. 971,139, Nov. 3, 1992, abandoned.

[51] Int. Cl.⁶ .............................................. H05K 7/20
[52] U.S. Cl. .................................... 361/704; 174/16.3; 174/52.2; 257/706; 257/787; 361/714; 361/717; 361/722
[58] Field of Search ............... 174/16.3, 52.2, 52.3, 174/52.4; 257/706, 722, 737, 786–787, 790; 361/383, 386–389, 400, 402, 406, 410

[56] References Cited

U.S. PATENT DOCUMENTS

| | | | |
|---|---|---|---|
| 4,604,644 | 8/1986 | Beckham et al. | 257/737 |
| 4,825,284 | 4/1989 | Soga et al. | 357/80 |
| 4,970,575 | 11/1990 | Soga et al. | 257/786 |
| 4,987,100 | 1/1991 | McBride et al. | 437/206 |
| 5,107,325 | 4/1992 | Nakayoshi | 357/69 |
| 5,177,669 | 1/1993 | Juskey et al. | 361/386 |
| 5,222,014 | 6/1993 | Lin | 361/414 |
| 5,239,198 | 8/1993 | Lin et al. | 257/787 |
| 5,249,101 | 9/1993 | Frey et al. | 361/717 |
| 5,291,062 | 3/1994 | Higgins, III | 257/698 |
| 5,311,402 | 10/1994 | Kobayashi et al. | 361/760 |

FOREIGN PATENT DOCUMENTS 0135051  5/1989  Japan .................................. 361/400

*Primary Examiner*—Gregory D. Thompson
*Attorney, Agent, or Firm*—Minh-Hien N. Clark

[57] ABSTRACT

A thermally enhanced semiconductor device (10) having an exposed backside (22) is described. In one embodiment, a PC board substrate (12) is provided having a pattern of conductive traces (14) on both upper and lower surfaces of the substrate. Electrical continuity is maintained between the two surfaces with conductive vias (16). A semiconductor die (18) is flip-mounted to the upper surface of the substrate. Solder bumps (26) electrically connect the die to the conductive traces, and an underfill (28) couples the active side (20) of the die to the upper surface of the substrate. A package body (40) is formed around the perimeter (24) of the die leaving the inactive backside exposed for enhanced thermal dissipation. The inactive backside can also be coupled to a heat sink for increased thermal dissipation. A plurality of solder balls (42) electrically connected to the conductive traces is attached to the lower surface of the substrate.

20 Claims, 3 Drawing Sheets

THERMALLY ENHANCED SEMICONDUCTOR DEVICE HAVING EXPOSED BACKSIDE AND METHOD FOR MAKING THE SAME

This application is a continuation of prior application Ser. No. 07/971,139, filed Nov. 3, 1992, now abandoned.

CROSS-REFERENCE TO RELATED APPLICATION

Related subject matter is disclosed in U.S. Pat. application by Ziep Tran et al., entitled "Bumped Leadless Semiconductor Device and Method for Its Fabrication," application No. 07/909,483 filed on Jul. 6, 1992 and assigned to the assignee hereof.

1. Field of the Invention

This invention relates to semiconductor devices in general, and more specifically to thermally enhanced pad array carrier semiconductor devices having an exposed backside.

2. Background of the Invention

Semiconductor devices are widely used in various types of electronic products, portable consumer products, automobiles, integrated circuit cards, and the like. One feature of semiconductor devices which is important in many of these applications is the size of a semiconductor device, which includes both the semiconductor die and the package in which it is housed. In particular, it is desirable to keep the footprint or X-Y dimensions of the device small in addition to keeping the profile or Z dimension of the device thin. The development of plastic encapsulated pad array carrier semiconductor devices has provided some advantages over conventional leaded packages. These overmolded devices allow greater input/output (I/O) densities without undue size increases. Additionally, the overmolded devices are surface mount packages which are desirable in today's applications.

The general construction of a plastic encapsulated pad array carrier semiconductor device includes a semiconductor die mounted on an upper surface of a PC board substrate and a plurality of solder balls attached to a lower surface of the PC board substrate. The semiconductor die is electrically connected to a pattern of conductive traces on the PC board substrate by conventional wire bonds or low loop wire bonds. The semiconductor device has an overmolded plastic resin package body that protects the semiconductor die and the wire bonds, which means that the package body must be thicker than the die and the loop height of the wire bonds to fully cover them. Thin semiconductor dice, typically between 10–14 mils (0.254–0.356 millimeter), are used in the current plastic encapsulated pad array carrier device to keep the profile of the device low.

Because of the small size of the plastic encapsulated pad array carrier semiconductor device, this type of package is becoming increasingly popular. However, the current configuration of these devices has limited thermal dissipation. The thermal resistance of the current device is approximately in a range of 10° C./W to 40° C./W. However, as devices become faster, higher thermal dissipation in a package configuration becomes necessary. Typical high frequency devices that are packaged in these plastic encapsulated pad array carriers are microprocessors, digital signal processors (DSPs) and application specific integrated circuits (ASICs).

Another potential limitation of the current configuration of plastic encapsulated pad array carrier semiconductor device is its thickness. Many consumer portable product applications require low profile devices. This requirement will be difficult to fulfill because a trend in semiconductor wafer technology toward larger diameter wafers essentially calls for thicker wafers to reduce wafer breakage problems. Thicker wafers translate into thicker semiconductor die which means the package body must be thicker to cover the die and the wire bonds. A typical 200 millimeter (approximately 8 inches) unthinned wafer is approximately 0.730 to 0.765 millimeter. If an unthinned semiconductor die is housed in the current plastic encapsulated device, the thickness of the device would increase by approximately 0.38 to 0.50 millimeter.

It would be desirable to have a plastic encapsulated pad array carrier semiconductor device with enhanced thermal dissipation in addition to being a thin device housing a semiconductor die that does not require thinning.

SUMMARY OF THE INVENTION

This invention provides a thermally enhanced pad array carrier semiconductor device having an exposed silicon backside and a method for its fabrication. In accordance with one embodiment of the invention, a semiconductor device is fabricated by providing a PC board substrate having first and second surfaces and a pattern of conductive traces extending from the first surface to the second surface. A semiconductor die having an active side, an inactive backside, and a perimeter, is flip-mounted on the first surface of the substrate to expose the inactive backside. The semiconductor die is electrically connected to the pattern of conductive traces. An electrically nonconductive coupling material is placed between the active side of the semiconductor die and the first surface of the PC board substrate. A package body is formed around the perimeter of the semiconductor die, wherein the package body covers a portion of the pattern of conductive traces and any portion of the coupling material that extends beyond the perimeter of the semiconductor die. The package body leaves the inactive backside of the semiconductor die exposed. Additionally, a plurality of solder balls is attached to the second surface of the substrate, wherein the plurality of solder balls is electrically connected to the pattern of conductive traces. This invention also provides a semiconductor device structure corresponding to the method for its fabrication.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
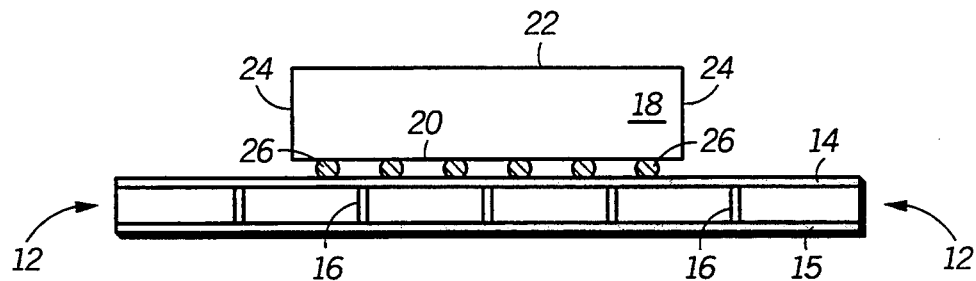
FIGS. 1–2 illustrate, in cross-section, process steps for the fabrication of a semiconductor device in accordance with a first embodiment of the invention.

The invention will now be discussed in detail with reference to the figures. FIGS. 1–6 illustrate, in cross-section, process steps for the fabrication of a semiconductor device 10 in accordance with a first embodiment of the invention, where completed device 10 is illustrated in FIG. 6. As illustrated in FIG. 1, a PC board substrate 12 is provided wherein the substrate 12 has patterns of conductive traces 14 and 15 on the upper (first) surface of the substrate 12 and the lower (second) surface respectively. The PC board substrate 12 is typically made of a bismaleimide-triazine (BT) resin, but other polymers could also be used. The pattern of conductive traces 14 is electrically connected from the upper surface of the substrate 12 to the traces 15 on the lower surface by way of a plurality of conductive vias 16. Conductive vias 16 can be either concentric vias or offset vias, meaning that external electrical connections can be made either directly to the concentric vias or they can be made to traces that are electrically connected to the offset vias. The pattern of conductive traces 14 and 15 are depicted as continuous layers on the top and bottom surfaces of the substrate 12 for ease of illustration. The specific configuration of the patterns of conductive traces 14 and 15 will vary depending on the semiconductor device.

In FIG. 1, a semiconductor die 18 is flip-mounted onto the upper surface of the PC board substrate 12 by way of flip-chip bonding. Semiconductor die 18 has an active side 20, an inactive backside 22, and a perimeter 24. The inactive backside 22 is exposed since the semiconductor die 18 is flip-mounted. Semiconductor die 18 is electrically connected to the pattern of conductive traces 14 by a plurality of solder bumps 26. The method of direct chip attach or flip-chip bonding is well known in the art. An advantage to using flip-chip bonding in this embodiment of the invention is that conventional wire bonds are eliminated so that protecting the wire bonds and their respective wire loops is no longer necessary.

Figure 2:
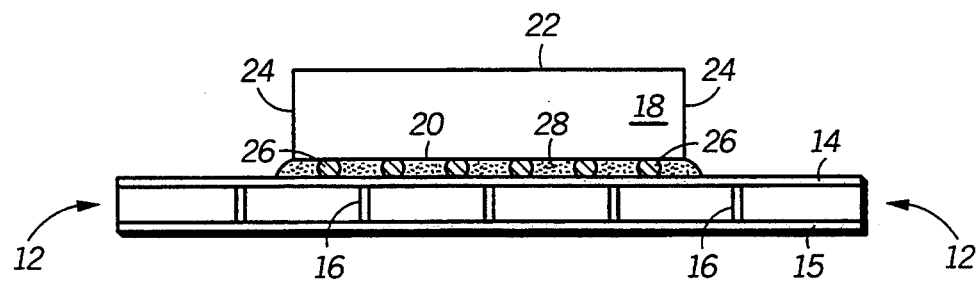

In FIG. 2, the next process step for the fabrication of a first embodiment of the invention is illustrated. The substrate 12 with the flip-chip bonded semiconductor die 18 is underfilled with an electrically nonconductive coupling material 28. Coupling material 28 is typically, but not limited to, an epoxy resin filled with synthetic glass. The filler is typically synthetic to control the alpha particle count which can cause soft error failure in some semiconductor devices. Coupling material 28, which is normally referred to as an underfill in the art, is necessary for flip-chip bonding because it acts as a stress buffer or stress equalizer. The coefficient of thermal expansion of the PC board substrate 12 is substantially different from the coefficient of thermal expansion of the silicon die 18, on the order of $60 \times 10^{-7}/°$ C. versus $26 \times 10^{-7}/°$ C., respectively. Therefore, the underfill 28 should have a coefficient of thermal expansion approximately half-way between the two extremes so as to reduce the thermal mismatch between the substrate 12 and semiconductor die 18. Underfill 28 may extend past the perimeter 24 of the semiconductor die 18 as illustrated in FIG. 2. Another advantage to having the underfill 28 is that it serves as added protection for the semiconductor die 18 from contaminants such as moisture, chlorine, flourine, sodium ions or other contaminating ions.

Figure 3:
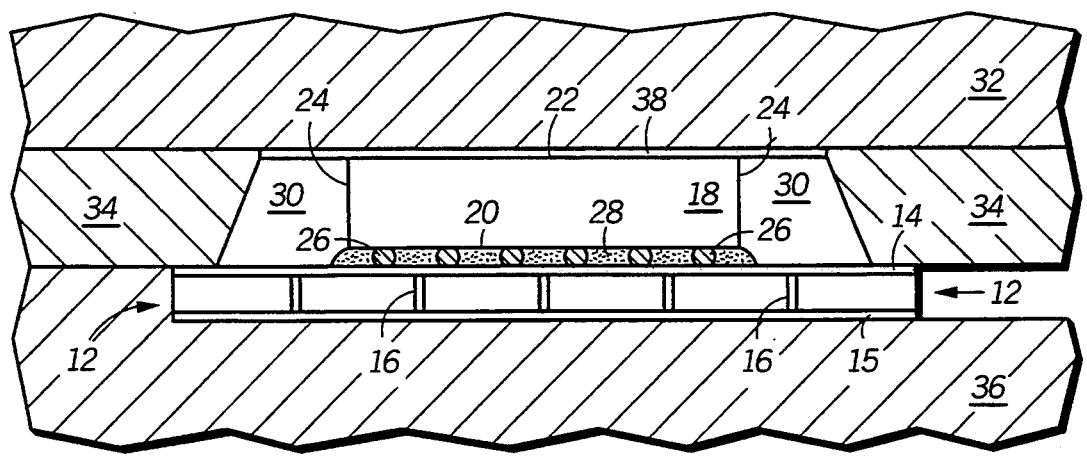
FIG. 3 illustrates, in cross-section, a molding process step using a plate mold for fabricating the semiconductor device of the first embodiment of the invention.

FIG. 3 illustrates the next process step in the fabrication of the semiconductor device 10 where the substrate 12 with the semiconductor die 18 flip-mounted on the top surface of the substrate 12 is placed inside a mold cavity 30 to form a package body. The mold cavity 30 is defined by mold platens 32, 34, and 36 of a plate mold (not illustrated). A layer of tape 38 is placed inside the mold cavity so that the tape 38 makes contact with the inactive backside 22 of the semiconductor die 18. This layer of tape 38 is thin so that the normal clamp pressure of the die platens 32, 34, and 36 during the molding operation is enough to prevent flashing of the molding compound outside of the cavity 30. The adhesion of the tape 38 is such that it adheres better to silicon than to the top mold platen 32, so that the tape 38 adheres to the inactive backside 22 of the die 18 when the molded unit is ejected from the mold cavity 30. The tape 38 should be substantially as large in size as the package body of the device. The tape 38 serves to prevent flash of molding compound onto the edges of the inactive backside 22 of the semiconductor die 18 to enhance the appearance of the finished product. An added advantage to not having flash on the inactive backside 22 of the die 18 is that a better thermal dissipation path is maintained from the die to the environment. The package body is typically formed from, but not limited to, a resin encapsulant, such as epoxy resin molding compound. Conventional transfer molding equipment can be used to form the package body. Alternatively, the package body can be made by injection molding or pour molding. It should be noted that the package body is formed on only the top surface of the substrate 12, hence the term "overmolded" or "overmolding" is used to describe this process.

As illustrated in FIG. 3, upper mold platen 34 does not have vertical walls but rather tapered sidewalls with a draft angle. Tapered sidewalls are not required to practice the invention but they do aid in the release of the overmolded part from the mold tool. Typical draft angles range from approximately 3° to 7°, although other draft angles may also be used. Also illustrated in FIG. 3 are two possible configurations for the lower mold platen 36. The left half of FIG. 3 depicts the lower mold platen 36 forming a recess so that the substrate 12 fits into this recess. The right half of FIG. 3 depicts the lower mold platen 36 being flat and that the substrate 12 is situated thereabove. Either configuration allows for the overmolding to be completed.

Figure 4:
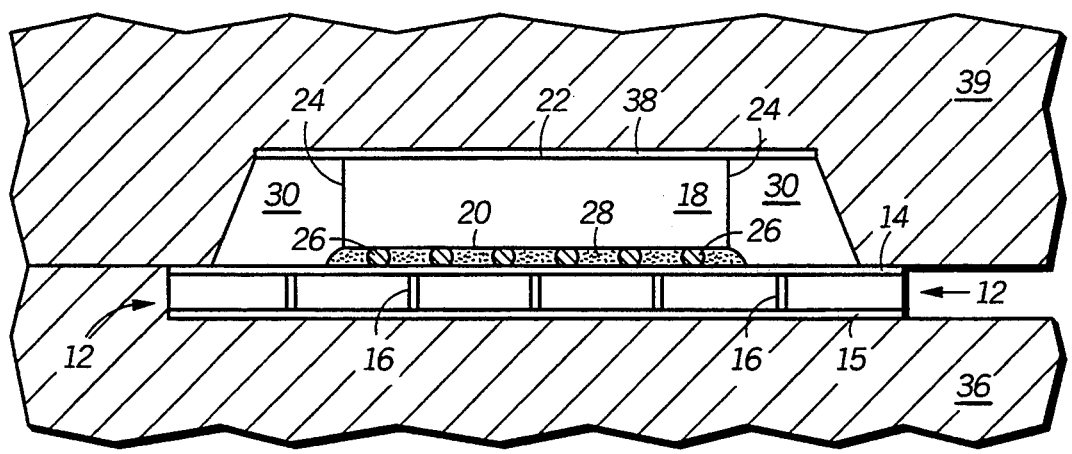
FIG. 4 illustrates, in cross-section, an alternative molding process step using a conventional cavity mold for fabricating the semiconductor device of the first embodiment of the invention.

FIG. 4 illustrates, in cross section, an alternative molding process step for the semiconductor device. In this illustration, the mold cavity 30 is defined by lower mold platen 36 and upper mold platen 39. This mold cavity configuration is typical of a conventional cavity mold in transfer molding equipment. Again, the sidewalls are tapered for ease of removal of the molded device. The lower mold platen 36 is also depicted as being either recessed or flat, as previously illustrated in FIG. 3. Either configuration allows for proper overmolding to occur.

Figure 5:
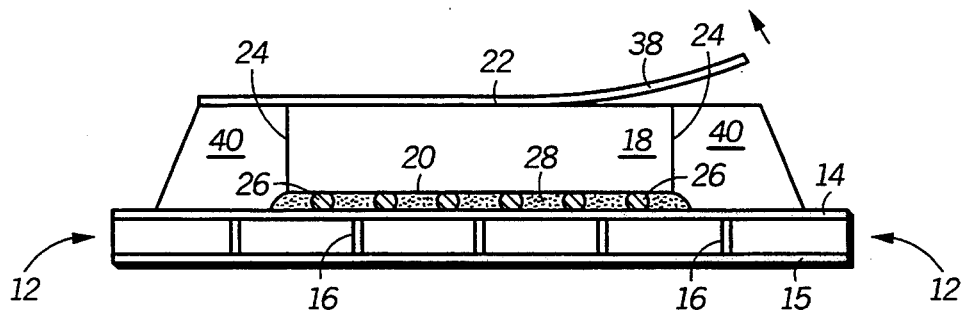
FIGS. 5–6 illustrate, in cross-section, remaining process steps for the fabrication of a semiconductor device in accordance with a first embodiment of the invention.
Figure 6:
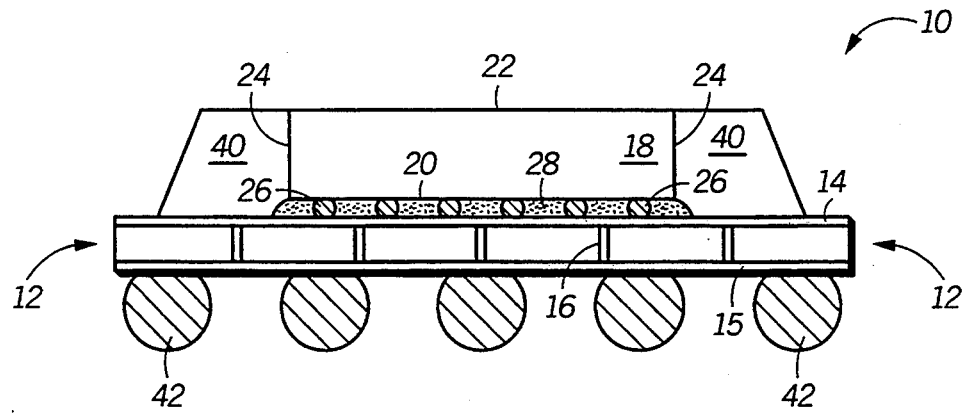

As illustrated in FIG. 5, a package body 40 conforming to the shape of the mold cavity 30 is formed around the perimeter 24 of the semiconductor die 18 after the overmolding process. Package body 40 has tapered sidewalls. The package body 40 covers a portion of the pattern of conductive traces 14 on the top surface of the PC board substrate 12 and the portion of underfill 28 that extends beyond the perimeter 24 of the semiconductor die 18. As illustrated in FIG. 4, the tape 38 is removed from the top surface of the package body 40. Upon removal of the tape 38, the inactive backside 22 of the semiconductor die 18 is exposed. Since silicon is a good thermal conductor, exposing the inactive backside 22 to the environment will enhance the thermal dissipation of the finished device over a similar device where a package body completely covers the semiconductor die. An reduction in thermal resistance from 10 ° C./W in the current configuration to 1° C./W with the new configuration is possible. Furthermore, to make good use of the reduced thermal resistance path, a heat radiator, a heat sink or a cold plate can be directly attached to the exposed inactive backside 22 with a thermal grease or some other suitable method.

Illustrated in FIG. 6 is a the final process step for a finished thermally enhanced semiconductor device 10. A plurality of solder balls 42 is attached to the second surface of the PC board substrate 12. The solder balls 42 can be made of any electrically conductive metal such as lead, tin, or an alloy thereof. The solder balls 42 are electrically connected to the pattern of conductive traces 14. Although the illustration may seem as if all of the solder balls 42 are electrically connected to each other because the pattern of conductive traces 14 is illustrated as a continuous layer on both the top and bottom surfaces of the substrate 12, the solder balls 42 are not shorted to each other because the pattern of conductive traces 14 will determine the electrical paths for each of the solder balls 42. The pattern of conductive traces 14 are only depicted as continuous layers for ease of illustration. Actual patterns of conductive traces will vary depending on the semiconductor device.

The remaining figures which illustrate further embodiments of the present invention incorporate many of the same or similar elements as those described above in reference to device 10. Therefore, like reference numerals designate identical or corresponding parts throughout the several views which follow.

Figure 7:
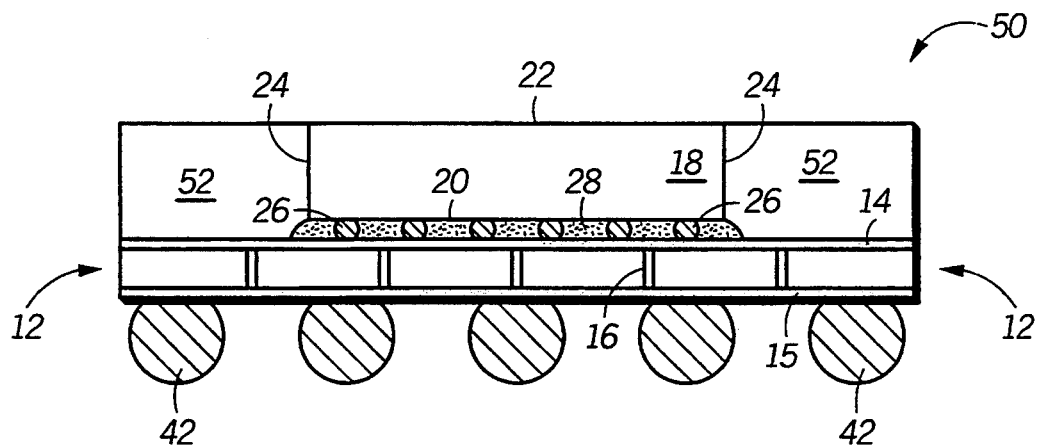
FIG. 7 illustrates, in cross-section, a semiconductor device in accordance with a second embodiment of the invention.

FIG. 7 illustrates, in cross-section, a semiconductor device 50 in accordance with a second embodiment of the invention. In this embodiment the semiconductor device 50 has a package body 52 around the perimeter 24 of semiconductor die 18. Package body 52 also exposes the inactive backside 22 of the semiconductor die 18 to allow enhanced thermal dissipation of the device. In this illustration, package body 52 also extends to the edges of the PC board substrate 12, so that the device 50 does not have edge traces exposed as in the case of device 10 of FIG. 6. Additionally, package body 52 has vertical sidewalls instead of tapered sidewalls to illustrate a second embodiment of the invention.

Figure 8:
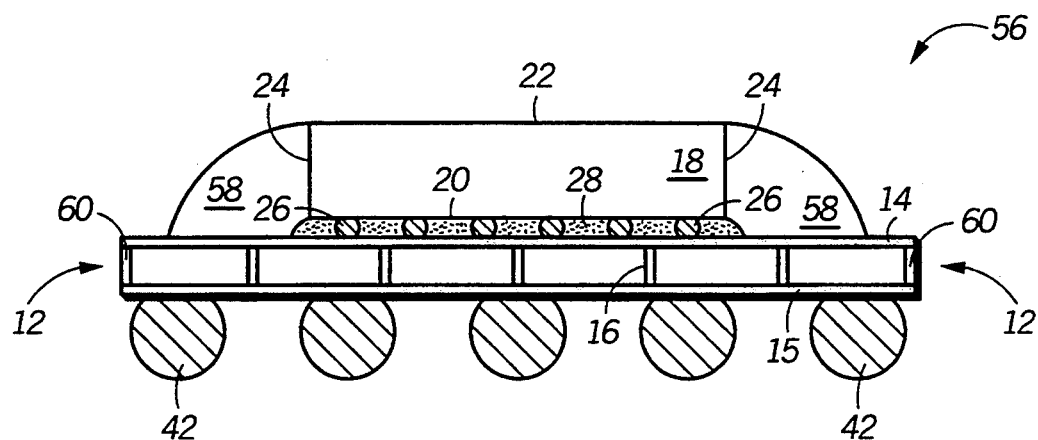
FIG. 8 illustrates, in cross-section, a semiconductor device in accordance with a third embodiment of the invention.

FIG. 8 illustrates, in cross-section, a semiconductor device 56 in accordance with a third embodiment of the invention. In this embodiment, semiconductor device 56 has a partial glob top 58 or a controlled encapsulation for a package body. Partial glob top 58 surrounds the perimeter 24 of the semiconductor die 18 and leaves the inactive backside 22 of the die 18 exposed, again for enhanced thermal dissipation of the device. Partial glob top 58 can be formed from, but is not limited to, the following materials: filled epoxy resin, silicone, and urethane. Also illustrated in this embodiment is a variation in the conductive vias. In the previous embodiments, all the vias 16 were illustrated to be internal vias. In other words, the vias 16 are located internal to the PC board substrate 12. In FIG. 8, half-vias 60 are located at the edges of the PC board substrate 12. One reason why half-vias might be present in a device is that the PC board substrate was cut along some conductive vias because these substrates are manufactured in panel form before they are singulated for individual devices. Additionally, these half-vias may be present for ease of trace routing.

Figure 9:
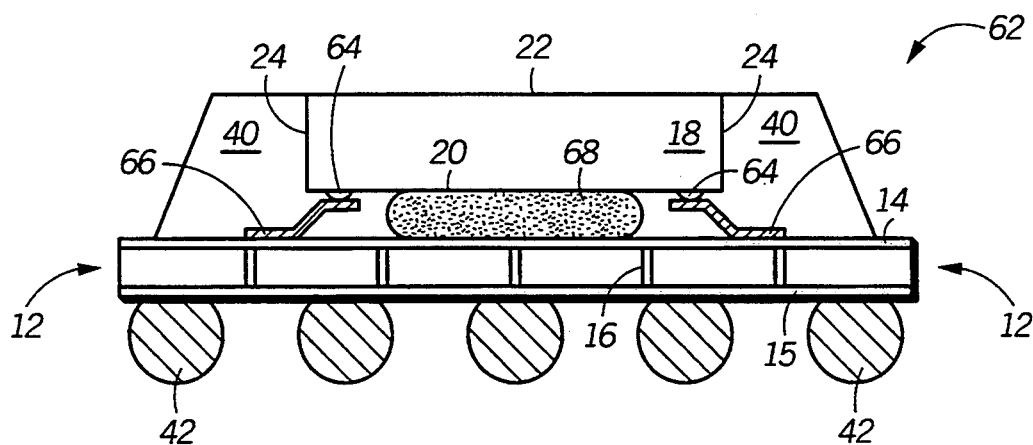
FIG. 9 illustrates, in cross-section, a semiconductor device in accordance with a fourth embodiment of the invention.

FIG. 9 illustrates, in cross section, yet another semiconductor device 62 in accordance with a fourth embodiment of the invention. In this embodiment, semiconductor die 18 is flip-mounted onto the top surface of the PC board substrate 12 by a flip-tape automated bonding (TAB) method. The semiconductor die 18 has a plurality of conductive bumps 64 on its active side 20, wherein the conductive bumps 64 are electrically connected to electrical bonding pads (not shown) on the active side 20 of the die 18. The conductive bumps 64 are connected to a plurality of conductive contacts 66 which can bonded to the pattern of conductive traces 14 on the PC board substrate 12 by a conventional TAB outer lead bonding (OLB) method. A coupling material 68 is placed between the active side 20 of the die 18 and the top surface of the substrate 12 to provide a stand-off for the semiconductor die 18. Coupling material 68 is compliant and electrically nonconductive. During the overmolding process, coupling material 68 exerts pressure on the die 18 to keep it flushed to the top mold platen of the mold cavity to reduce mold flash during the filling of the mold cavity with a molding compound. The pressure exerted by coupling material 68 also keeps the semiconductor die 18 in place during molding. Compliant material 68 can be formed from, but is not limited to, a silicone rubber or a room temperature vulcanizing rubber (RTV). It is possible to have preforms of the coupling material 68 which can be applied with an adhesive (not illustrated) to both the active side 20 of the die 18 and to the top surface of the PC board substrate 12. The coupling material 68 should be applied before the OLB step.

As illustrated in FIG. 9, the package body 40 is formed from a resin encapsulant such as an epoxy resin molding compound. However, it is also possible to have a partial glob top package body such as the one illustrated in FIG. 8. In either case, the package body leaves the inactive backside 22 of the die 18 exposed for enhanced thermal dissipation.

One major advantage to the embodiments of the invention, in addition to the enhanced thermal dissipation of the devices, is that thick semiconductor dice can be used without increasing the thickness of the finished product. The package body does not have to completely cover the thickness of the die and the loop height of the wire bonds as in the current overmolded pad array carrier semiconductor device. There are no wire bonds to protect in the new configurations. Also, the package body is only as thick as the die plus the coupling material, but not thicker. Therefore, it is possible to use unthinned die in these embodiments which would be advantageous for semiconductor wafer handling issues.

The foregoing description and illustrations contained herein demonstrate many of the advantages associated with the present invention. In particular, it has been revealed that a manufacturing process which utilizes conventional techniques and equipment can be used to fabricate a thermally enhanced overmolded semiconductor device with an exposed backside. Furthermore, unthinned semiconductor dice can be used in conjunction with the embodiments of the present invention without increasing the thickness of the device.

Thus it is apparent that there has been provided, in accordance with the invention, a thermally enhanced overmolded semiconductor device having an exposed backside and method for its fabrication which overcomes the problems associated with the prior art devices. Although the invention has been described and illustrated with reference to specific embodiments thereof, it is not intended that the invention be limited to these illustrative embodiments. Those skilled in the art will recognize that variations and modifications can be made without departing from the spirit of the invention. For example, the pattern of conductive traces used on a PC board substrate is not restricted by the present invention. The conductive trace pattern is dependent upon the types and configurations of the various semiconductor die used in a device. In addition, the present invention is not limited to any specific number or kind of semiconductor die used. A substrate accommodating multiple semiconductor dice may be used to fabricate a multiple chip device wherein the inactive backside of the dice are exposed after a packge body is formed. Furthermore, the package body may either be a single package body for all the dice, or individual package bodies may be formed for each die. Additionally, materials and methods other than those described for flip-mounting the semiconductor die and for overmolding the devices are possible. Furthermore, the invention is not limited to silicon semiconductor devices but is also applicable to any other type of semiconductors such as gallium arsenide. Also, solder ball configurations other than those specifically illustrated are anticipated as being suitable in practicing the invention. In addition, electrically conductive polymer balls may be used in place of solder balls to achieve external electrical connections. Therefore, it is intended that this invention encompass all such variations and modifications as fall within the scope of the appended claims.

We claim:

1. A semiconductor device comprising:
   a PC board substrate having first and second surfaces and first and second patterns of conductive traces on respective first and second surfaces, wherein the first and second patterns are electrically interconnected, the substrate having a first coefficient of thermal expansion;
   a semiconductor die having an active side, an inactive backside, a sidewall, and a perimeter, wherein the semiconductor die is flip-mounted on the first surface of the PC board substrate to expose the inactive backside, the semiconductor die being bonded to the first pattern of conductive traces, the semiconductor die having a second coefficient of thermal expansion;
   an electrically nonconductive coupling material between the active side of the semiconductor die and the first surface of the PC board substrate, wherein the coupling material covers at least a center area of the active side of the semiconductor die but does not cover the sidewall of the semiconductor die, the coupling material having a third coefficient of thermal expansion that is substantially an average of the first and second coefficients of thermal expansion;
   a package body around the perimeter of the semiconductor die, wherein the package body covers a portion of the first pattern of conductive traces on the first surface of the PC board substrate and any portion of the coupling material that extends beyond the perimeter of the semiconductor die, the package body leaving the inactive backside of the semiconductor die exposed for enhanced thermal dissipation; and
   a plurality of solder balls physically attached to the second pattern of conductive traces on the second surface of the PC board substrate, wherein at least some of the plurality solder balls provide external electrical connections for the semiconductor device.

2. The semiconductor device of claim 1 wherein the package body comprises a resin encapsulant.

3. The semiconductor device of claim 1 wherein the package body comprises a partial glob top material selected from a group consisting of: filled epoxy resin, silicone, and urethane.

4. The semiconductor device of claim 1 wherein the semiconductor die is electrically connected to the first pattern of conductive traces by flip-chip bonding.

5. The semiconductor device of claim 1 wherein the semiconductor die is electrically connected to the first pattern of conductive traces by flip-TAB bonding.

6. The semiconductor device of claim 1 wherein the first pattern of conductive traces is electrically connected from the first surface of the PC board substrate to the second pattern of conductive traces on the second surface of the PC board substrate by way of a conductive via.

7. The semiconductor device of claim 4 wherein the coupling material comprises an underfill material composed of a filled epoxy resin.

8. The semiconductor device of claim 5 wherein the coupling material comprises a compliant material selected from a group consisting of: a silicone rubber and an RTV rubber.

9. A semiconductor device comprising:
   a PC board substrate having first and second surfaces and first and second patterns of conductive traces on respective first and second surfaces, wherein the first and second patterns are electrically interconnected;
   a plurality of conductive TAB contacts outer-lead bonded at a first end to the first pattern of conductive traces on the first surface of the PC board substrate;
   a semiconductor die having an active side, an inactive backside, a sidewall, and a perimeter, wherein the semiconductor die is flip-mounted on the first surface of the PC board substrate to expose the inactive backside, and wherein a second end of the plurality of conductive TAB contacts is flip-TAB inner-lead bonded to the active side to electrically connect the semiconductor die to the first pattern of conductive traces;

a preformed electrically nonconductive compliant material positioned between the active side of the semiconductor die and the first surface of the PC board substrate to provide a stand-off, wherein the compliant material covers at least a center area of the active side of the semiconductor die but does not cover the sidewall of the semiconductor die;

a package body around the perimeter of the semiconductor die, wherein the package body covers the sidewall of the semiconductor die, the plurality of conductive TAB contacts and a portion of the first pattern of the conductive traces on the first surface of the substrate, the package body leaving the inactive backside of the semiconductor die exposed for enhanced thermal dissipation; and a plurality of solder balls physically attached to the second pattern of conductive traces on the second surface of the PC board substrate, wherein at least some of the plurality solder balls provide external electrical connections for the semiconductor device.

10. The semiconductor device of claim 9 wherein the package body comprises a resin encapsulant.

11. The semiconductor device of claim 9 wherein the package body comprises a partial glob top material selected from a group consisting of: filled epoxy resin, silicone, and urethane.

12. The semiconductor device of claim 9 wherein the first pattern of conductive traces is electrically connected from the first surface of the PC board substrate to the second pattern of conductive traces on the second surface of the PC board substrate by way of a conductive via.

13. The semiconductor device of claim 9 wherein the compliant material comprises a material selected from a group consisting of: silicone rubber and an RTV rubber.

14. A method for fabricating a semiconductor device comprising the steps of:

providing a PC board substrate having a first coefficient of thermal expansion, first and second surfaces and first and second patterns of conductive traces on respective first and second surfaces, wherein the first and second patterns are electrically connected;

providing a semiconductor die having a second coefficient of thermal expansion, an active side, an inactive backside, a sidewall, and a perimeter;

electrically connecting the semiconductor die to the first pattern of conductive traces on the first surface of the PC board substrate, wherein the inactive backside of the semiconductor die is exposed;

placing an electrically nonconductive coupling material having a third coefficient of thermal expansion that is substantially an average of the first and second coefficients of thermal expansion between the active side of the semiconductor die and the first surface of the PC board substrate, wherein the coupling material covers at least a center area of the active side of the semiconductor die but does not cover the sidewall of the semiconductor die;

forming a package body around the perimeter of the semiconductor die wherein the package body covers a portion of the first pattern of conductive traces and any portion of the coupling material that extends beyond the perimeter of the semiconductor die, the package body leaving the inactive backside of the semiconductor die exposed for enhanced thermal dissipation; and attaching a plurality of solder balls to the second pattern of conductive traces on the second surface of the PC board substrate wherein at least some of the plurality of solder balls provide external electrical connections for the semiconductor device.

15. The method of claim 14 further comprising the steps of:

providing a layer of tape that adheres to the inactive backside of the semiconductor die during the step of forming a package body, the layer of tape being substantially as large in size as the package body; and removing the layer of tape from the inactive side of the semiconductor die and a surface of the package body after the step of forming a package body.

16. The method of claim 14 wherein the step of forming a package body comprises overmolding a resin encapsulant using transfer molding equipment.

17. The method of claim 14 wherein the step of forming a package body is performed by using a partial glob top or controlled encapsulation process.

18. The method of claim 14 wherein the step of electrically connecting the semiconductor die comprises flip-chip bonding of the semiconductor die to the first pattern of conductive traces on the first surface of the PC board substrate.

19. The method of claim 14 wherein the step of electrically connecting the semiconductor die comprises flip-TAB bonding of the semiconductor die to the first pattern of conductive traces on the first surface of the PC board substrate.

20. The method of claim 14 wherein the step of providing a PC board substrate comprises providing a PC board substrate having first and second patterns of conductive traces that are electrically connected to each other by way of a conductive via.

* * * * *